United States Patent
Namba et al.

(10) Patent No.: US 12,044,971 B2
(45) Date of Patent: *Jul. 23, 2024

(54) AQUEOUS DEVELOPER FOR FLEXOGRAPHIC PRINTING PLATE AND MANUFACTURING METHOD OF FLEXOGRAPHIC PRINTING PLATE

(71) Applicant: FUJIFILM Corporation, Tokyo (JP)

(72) Inventors: Yusuke Namba, Haibara-gun (JP); Taira Murakami, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 275 days.

This patent is subject to a terminal disclaimer.

(21) Appl. No.: 17/495,064

(22) Filed: Oct. 6, 2021

(65) Prior Publication Data
US 2022/0026808 A1 Jan. 27, 2022

Related U.S. Application Data

(63) Continuation of application No. PCT/JP2020/014862, filed on Mar. 31, 2020.

(30) Foreign Application Priority Data

Apr. 12, 2019 (JP) ................ 2019-076184

(51) Int. Cl.
| | | |
|---|---|---|
| G03F 7/32 | (2006.01) | |
| B41C 1/00 | (2006.01) | |
| B41N 1/12 | (2006.01) | |
| G03F 7/004 | (2006.01) | |
| G03F 7/20 | (2006.01) | |

(52) U.S. Cl.
CPC ............... G03F 7/32 (2013.01); B41C 1/00 (2013.01); B41N 1/12 (2013.01); G03F 7/0045 (2013.01); G03F 7/2006 (2013.01)

(58) Field of Classification Search
CPC .................................................. G03F 7/20
See application file for complete search history.

(56) References Cited

U.S. PATENT DOCUMENTS

| | | |
|---|---|---|
| 2006/0194154 A1 | 8/2006 | Chen et al. |
| 2010/0248151 A1* | 9/2010 | Tomita ............ G03F 7/24 |
| | | 430/306 |
| 2014/0377705 A1 | 12/2014 | Koyama et al. |

FOREIGN PATENT DOCUMENTS

| | | |
|---|---|---|
| CN | 104136995 A | 11/2014 |
| EP | 0 897 136 A1 | 2/1999 |
| EP | 2 869 122 A1 | 5/2015 |
| JP | 6-258847 A | 9/1994 |
| JP | H06258847 A * | 9/1994 |
| JP | 07-114180 A | 5/1995 |
| JP | 8-339090 A | 12/1996 |
| JP | 08339090 A * | 12/1996 |
| JP | H08339090 A * | 12/1996 |
| JP | 9-040728 A | 2/1997 |
| JP | 9-171261 A | 6/1997 |
| JP | H09171261 A * | 6/1997 |
| JP | 2003-066605 A | 3/2003 |
| JP | 2003-287906 A | 10/2003 |
| JP | 2004-317660 A | 11/2004 |
| JP | 2009-143988 A | 7/2009 |

OTHER PUBLICATIONS

Extended European Search Report dated May 16, 2022 in European Application No. 20788486.7.
Office Action dated Dec. 6, 2022 from the Japanese Patent Office in JP Application No. 2021-513586.
International Preliminary Report on Patentability dated Sep. 28, 2021 in International Application No. PCT/JP2020/014862.
Written Opinion of the International Searching Authority dated Jun. 16, 2020 in International Application No. PCT/JP2020/014862.
International Search Report dated Jun. 16, 2020 in International Application No. PCT/JP2020/014862.
Notice of Reasons for Refusal dated Jul. 19, 2022 from the Japanese Patent Office in JP Application No. 2021-513586.
Office Action issued Aug. 30, 2023 in Chinese Application No. 202080027925.9.

\* cited by examiner

*Primary Examiner* — Chanceity N Robinson
(74) *Attorney, Agent, or Firm* — Sughrue Mion, PLLC

(57) ABSTRACT

An aqueous developer for a flexographic printing plate capable of maintaining good developability and suppressing aggregation of a dispersion in the developer diluted with water after repeated use, and a manufacturing method of a flexographic printing plate using the same, are provided. The aqueous developer for a flexographic printing plate contains a surfactant represented by Formula (1), and water:

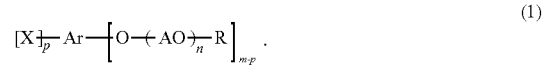

(1)

5 Claims, No Drawings

AQUEOUS DEVELOPER FOR FLEXOGRAPHIC PRINTING PLATE AND MANUFACTURING METHOD OF FLEXOGRAPHIC PRINTING PLATE

CROSS-REFERENCE TO RELATED APPLICATIONS

This application is a Continuation of PCT International Application No. PCT/JP2020/014862 filed on Mar. 31, 2020, which claims priority under 35 U.S.C. § 119(a) to Japanese Patent Application No. 2019-076184 filed on Apr. 12, 2019. Each of the above applications is hereby expressly incorporated by reference, in its entirety, into the present application.

BACKGROUND OF THE INVENTION

1. Field of the Invention

The present invention relates to an aqueous developer for a flexographic printing plate and a manufacturing method of a flexographic printing plate using the same.

2. Description of the Related Art

In recent years, various industries have started to reduce the use of organic solvents from the viewpoint of improving the working environment and preserving the global environment, and in a plate making step of a photosensitive flexographic printing plate used for printing, the use of an aqueous developable photosensitive resin plate is increasing.

For example, JP2003-287906A discloses "an aqueous developer composition for a photosensitive polymer including an alkylene oxide adduct of a secondary alcohol having HLB 10 to 14 and having 8 to 20 carbon atoms, and a compound represented by Formula (I),

[in Formula (I), R and $R_1$ represent an alkyl group or alkenyl group having 2 to 6 carbon atoms, A represents an alkylene group having 2 to 4 carbon atoms, and n represents a number of 1 to 5]" ([claim 1]).

In addition, JP2004-317660A discloses "an aqueous developer composition for a photosensitive resin consisting of at least a surfactant (A), a pH adjuster (B), a washing accelerator (C), and water, in which the surfactant (A) includes an alkylene oxide adduct of a primary alcohol having at least HLB 12 to 16 and having 6 to 8 carbon atoms, the pH adjuster (B) is an inorganic salt, the pH of the aqueous developer is 8 to 13, and the washing accelerator (C) includes a compound represented by Formula (I) or (II),

in Formula (I), R and $R_1$ represent an alkyl group or alkenyl group having 2 to 6 carbon atoms, A represents an alkylene group having 2 to 4 carbon atoms, and n represents a number of 1 to 5, and in Formula (II), n is 6 to 20" ([claim 1]).

SUMMARY OF THE INVENTION

The present inventors have conducted an investigation on the aqueous developers disclosed in JP2003-287906A and JP2004-317660A, and have found that developability is good. However, it has been clarified that, in a case of repeatedly using the aqueous developers for two or more developments, a dispersion aggregates in the developer diluted with water in a case where the developer remaining on a printing plate or a wall surface of a bathtub of a developing device is washed (rinsed) with water, and there is a problem that the dispersion reattaches to the printing plate and stains the printed matter.

An object of the present invention is to provide an aqueous developer for a flexographic printing plate capable of maintaining good developability and suppressing aggregation of a dispersion in the developer diluted with water after repeated use, and a manufacturing method of a flexographic printing plate using the same.

As a result of conducting intensive investigations to achieve the above-described object, the present inventors have found that an aqueous developer in which a surfactant having a predetermined structure is formulated is capable of maintaining good developability and suppressing the aggregation of the dispersion in the developer diluted with water after repeated use, and thus completed the present invention.

That is, the present inventors have found that the above-described object can be achieved by adopting the following configurations.

[1] An aqueous developer for a flexographic printing plate, comprising:
a surfactant represented by Formula (1); and
water,

here, in Formula (1),

Ar represents an m-valent aromatic group and m represents an integer of 1 to 8,

X represents a monovalent organic group and p represents an integer of 0 to 3, which is smaller than m, in a case where p is 2 or 3, a plurality of X's may be the same or different from each other, A represents an alkylene group having 2 to 4 carbon atoms, R represents a hydrogen atom or an anionic group, and n represents an integer of 1 to 100, in a case where n is an integer of 2 to 100, a plurality of A's may be the same or different from each other, and in a case where m−p is an integer of 2 to 6, a plurality of A's, n's, and R's may all be the same or different from each other.

[2] The aqueous developer for a flexographic printing plate according to [1],
in which a content of the surfactant is 0.1% to 20% by mass.

[3] The aqueous developer for a flexographic printing plate according to [1] or [2],
in which X in Formula (1) is an aralkyl group.

[4] The aqueous developer for a flexographic printing plate according to [3],
in which X in Formula (1) is a 2-phenylethan-2-yl group or a benzyl group.

[5] The aqueous developer for a flexographic printing plate according to any one of [1] to [4],
in which p in Formula (1) represents an integer of 1 to 3.

[6] The aqueous developer for a flexographic printing plate according to any one of [1] to [5],
in which R in Formula (1) represents a hydrogen atom.

[7] A manufacturing method of a flexographic printing plate having a non-image area and an image area, comprising:

an exposure step of imagewise exposing a photosensitive layer in a flexographic printing plate precursor having the photosensitive layer;

a development step of, after the exposure step, performing development using the aqueous developer for a flexographic printing plate according to any one of [1] to [6] to form a non-image area and an image area; and a rinse step of, after the development step, performing rinsing with water.

According to the present invention, it is possible to provide an aqueous developer for a flexographic printing plate capable of maintaining good developability and suppressing aggregation of a dispersion in the developer diluted with water after repeated use, and a manufacturing method of a flexographic printing plate using the same.

DESCRIPTION OF THE PREFERRED EMBODIMENTS

Hereinafter, the present invention will be described in detail.

The description of configuration requirements described below may be made on the basis of representative embodiments of the present invention, but it should not be construed that the present invention is limited to those embodiments.

In the specification of the present application, the numerical range expressed by using "to" means a range including the numerical values before and after "to" as the lower limit value and the upper limit value.

In addition, in this specification, for each component, one kind of substance corresponding to each component may be used alone, or two or more kinds thereof may be used in combination. Here, in a case where two or more kinds of substances are used in combination for each component, the content of the component indicates the total content of the substances used in combination, unless otherwise specified.

[Aqueous Developer for Flexographic Printing Plate]

An aqueous developer for a flexographic printing plate according to an embodiment of the present invention (hereinafter, also abbreviated as an "aqueous developer according to the embodiment of the present invention") is an aqueous developer for a flexographic printing plate, containing a surfactant represented by Formula (1) (hereinafter, also abbreviated as a "specific surfactant") and water.

(1)

In the present invention, as described above, the aqueous developer formulating the specific surfactant is capable of maintaining good developability and suppressing the aggregation of a dispersion in the developer diluted with water after repeated use.

Although the details thereof are not clear, the present inventors have assumed as follows.

First, the aqueous developer is usually used repeatedly for two or more times of development, but for example, in the developer used for the second development, a plate material removed from the flexographic printing plate precursor by the first development, that is, a plate material in a non-exposed portion (uncured portion) is present as a dispersion.

Therefore, in the present invention, it is considered that this is because, by formulating the specific surfactant, the specific surfactant and the dispersion are adsorbed to each other, and the adsorbed state can be maintained even in a case of being diluted with water assuming a rinse step. Specifically, since a structural portion (hydrophobic portion) represented by $[X]_p$—Ar— in Formula (1) is adsorbed to or approaches a periphery of the dispersion, and a structural portion (hydrophilic portion) represented by —[O-(AO)$_n$—R]$_{m-p}$ stabilizes dispersion of the dispersion in water, it is considered that the aggregation of the dispersion can be suppressed.

Hereinafter, each component contained in the aqueous developer according to the embodiment of the present invention will be described in detail.

[Specific Surfactant]

The specific surfactant contained in the aqueous developer according to the embodiment of the present invention is a surfactant represented by Formula (1).

(1)

In Formula (1), Ar represents an m-valent aromatic group and m represents an integer of 1 to 8.

In addition, in Formula (1), X represents a monovalent organic group and p represents an integer of 0 to 3, which is smaller than m. In a case where p is 2 or 3, a plurality of X's may be the same or different from each other.

In addition, in Formula (1), A represents an alkylene group having 2 to 4 carbon atoms, R represents a hydrogen atom or an anionic group, and n represents an integer of 1 to 100. In a case where n is an integer of 2 to 100, a plurality of A's may be the same or different from each other. In a case where m−p is an integer of 2 to 6, a plurality of A's, n's, and R's may all be the same or different from each other.

The aromatic group represented by Ar in Formula (1) refers to a group which includes a ring having aromaticity, and examples thereof include m-valent groups having at least one aromatic ring selected from the group consisting of an aromatic hydrocarbon ring and an aromatic heterocyclic ring.

Here, examples of the aromatic hydrocarbon ring include a benzene ring, a naphthalene ring, an anthracene ring, and a phenanthroline ring, and examples of the aromatic heterocyclic ring include a furan ring, a pyrrole ring, a thiophene ring, a pyridine ring, a thiazole ring, and a benzothiazole ring.

In addition, the valence (m) of the aromatic group represented by Ar in Formula (1) is an integer of 1 to 8, preferably an integer of 2 to 6, more preferably an integer of 2 to 4, and still more preferably 2 or 3.

Among these, as Ar, a divalent benzene ring (that is, a phenylene group) or a monovalent naphthalene ring (that is, a naphthyl group) is preferable, and a phenylene group is more preferable.

Examples of the monovalent organic group represented by X in Formula (1) include an alkyl group, a cycloalkyl group, an aryl group, an aralkyl group, and an alkenyl group, and these groups may further have a substituent.

Examples of the alkyl group include a linear or branched alkyl group having 1 to 18 carbon atoms, and specific examples thereof include a methyl group, an ethyl group, a propyl group, a butyl group, a pentyl group, a tert-pentyl group, and an n-hexyl group.

Examples of the cycloalkyl group include a monocyclic or polycyclic cycloalkyl group having 3 to 20 carbon atoms, and specific examples thereof include a cyclopentyl group, a cyclopentylmethyl group, a cyclopentylethyl group, a cyclohexyl group, a cyclohexylmethyl group, and a cyclohexylethyl group.

Examples of the aryl group include an aryl group having 6 to 14 carbon atoms, and specific examples thereof include a phenyl group, a methylphenyl group, a tolyl group, a xylyl group, a naphthyl group, an anthryl group, a phenanthryl group, and a pyrenyl group.

Examples of the aralkyl group include an aralkyl group having 7 to 20 carbon atoms, and specific examples thereof include a benzyl group, a phenethyl group, a 2-phenylethan-2-yl group, and a naphthylmethyl group.

Examples of the alkenyl group include an alkenyl group having 3 to 20 carbon atoms, and specific examples thereof include a vinyl group and an allyl group.

Among these organic groups, from the reason that the aggregation of the dispersion can be further suppressed, X in Formula (1) is preferably an aralkyl group, and more preferably a 2-phenylethan-2-yl group or a benzyl group.

Structures of the 2-phenylethan-2-yl group and the benzyl group are as shown in Formulae (X-1) and (X-2) described below, and the structure represented by Formula (X-1) (2-phenylethan-2-yl group) is also referred to as "styrenated" or "styryl group".

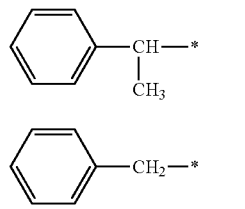

p in Formula (1) represents an integer of 0 to 3, which is smaller than m, and from the reason that the aggregation of the dispersion can be further suppressed, p preferably represents an integer of 1 to 3 and more preferably represents 1 or 2.

m–p in Formula (1) is preferably an integer of 1 to 3, more preferably 1 or 2, and still more preferably 1.

A in Formula (1) represents an alkylene group having 2 to 4 carbon atoms, and is preferably an alkylene group having 2 or 3 carbon atoms and more preferably an ethylene group or an n-propylene group.

Specific examples of the anionic group represented by one aspect of R in Formula (1) include a sulfuric acid group ($-SO_3^-$), a carboxy group ($-CO_2^-$), and a phosphoric acid group ($-PO_3^{2-}$). Among these, a sulfuric acid group is preferable.

These anionic groups may constitute salts. The above-described salt may be a salt with an inorganic cation or a salt with an organic cation.

Examples of the inorganic cation include a lithium cation, a sodium cation, a potassium cation, a calcium cation, and a magnesium cation. A lithium cation, a sodium cation, or a potassium cation is preferable, and a sodium cation or a potassium cation is more preferable.

Examples of the organic cation include ammonium ($NH^{4+}$), quaternary ammonium, quaternary pyridinium, and quaternary phosphonium. Ammonium, quaternary ammonium, or quaternary pyridinium is preferable, and quaternary ammonium is more preferable.

R in Formula (1) represents a hydrogen atom or an anionic group, and from the reason that the aggregation of the dispersion can be further suppressed, R is preferably a hydrogen atom.

n in Formula (1) represents an integer of 1 to 100, and from the reason that the aggregation of the dispersion can be further suppressed, is preferably an integer of 1 to 30, more preferably 5 to 20, and still more preferably 5 to 15.

In the present invention, from the reason that the aggregation of the dispersion can be further suppressed, a Hydrophile-Lipophile Balance (HLB) value of the specific surfactant is preferably less than 14 and more preferably 9 to 13.

Here, as the HLB value, a value obtained by Griffin's calculation expression is adopted.

In the Griffin's calculation expression, the HLB value is calculated according to the following expression using a value of S (saponification of ester) and a value of N (neutralization of fatty acid constituting ester).

As the HLB value is closer to 20, it is more hydrophilic, and as the HLB value is closer to 0, it is more lipophilic.

HLB value=20(1−S/N)

Specific examples of the specific surfactant include:
polyoxyalkylene polystyrylphenyl ethers such as polyoxyethylene styrenated phenyl ether, polyoxyethylene polystyrylphenyl ether, polyoxyethylene distyrenated phenyl ether, polyoxyethylene tristyrylphenol ether represented by Formula (1-1), polyoxyethylene styrenated phenyl ether ammonium sulfate, and polyoxyethylene polystyrylphenyl ether condensate; and
polyoxyethylene dodecylphenyl ether, polyoxyethylene phenyl ether, polyoxyethylene benzyl ether, polyoxyethylene β-naphthyl ether, polyoxyethylene bisphenol A ether, polyoxyethylene bisphenol F ether, polyoxyethylene cumylphenyl ether, polyoxyethylene naphthyl ether, polyoxyethylene tribenzylphenol ether, polyoxyethylene aryl ether, polyoxyethylene polycyclic phenyl ether, and polyoxyalkylene polycyclic phenyl ether.

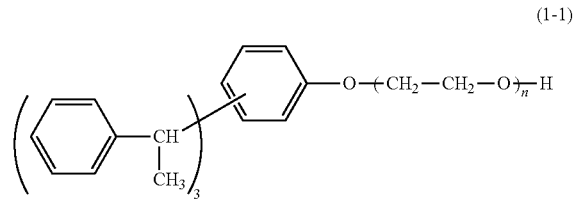

In the present invention, the content of the specific surfactant is preferably 0.1% to 20% by mass, more preferably 0.1% to 10% by mass, and still more preferably 1% to 5% by mass.

[Water]

The water contained in the aqueous developer according to the embodiment of the present invention is not particularly limited, and any of purified water, distilled water, ion exchange water, pure water, ultrapure water such as Milli-Q water can be used. The Milli-Q water is ultrapure water obtained by a Milli-Q water production device, which is an ultrapure water production device manufactured by Merck KGaA.

The content of water contained in the aqueous developer according to the embodiment of the present invention is preferably 80% to 99.99% by mass and more preferably 90% to 99.9% by mass with respect to the total mass of the aqueous developer.

[Alkali Metal Carbonate and Alkali Metal Hydroxide]

From the reason that the developability is better, the aqueous developer according to the embodiment of the present invention preferably contains at least one of an alkali metal carbonate or an alkali metal hydroxide, and more preferably contains at least an alkali metal carbonate.

Here, specific examples of the alkali metal include sodium, potassium, and calcium.

In addition, specific examples of the alkali metal carbonate include sodium carbonate, and potassium carbonate, and among these, sodium carbonate is preferable from the viewpoint of safety.

In addition, specific examples of the alkali metal hydroxide include sodium hydroxide and potassium hydroxide.

The content of the alkali metal carbonate and/or the alkali metal hydroxide (in a case where both are contained, the total content) is preferably 0.01% to 5% by mass and more preferably 0.1% to 1% by mass with respect to the total mass of the aqueous developer.

[Metal Sequestering Agent]

From the reason that the aggregation of the dispersion can be further suppressed, the aqueous developer according to the embodiment of the present invention preferably contains a metal sequestering agent.

Specific examples of the metal sequestering agent include citric acid, trisodium citrate, and ethylenediaminetetraacetic acid (EDTA).

[Other Components]

In the aqueous developer according to the embodiment of the present invention, various additives may be formulated as optional components, as required.

Examples of the additives include alkanolamines such as ethanolamine; preservatives such as benzotriazole and benzoic acid; freezing point depressants such as glycols (for example, ethylene glycol) and lower alcohols (for example, ethanol); and antifoaming agents such as silicones and polyols, and these can be appropriately formulated within a range which does not impair the effects of the present invention.

[Development Method]

As a development method using the aqueous developer according to the embodiment of the present invention, the same method as a developing method using a known aqueous developer in the related art may be used, and examples thereof include a method of bringing an aqueous developer into contact with a non-exposed portion of a flexographic printing plate precursor, applying a physical action of a brush, water pressure, supersonic waves, or the like, and dispersing a photosensitive layer (photosensitive resin composition) that constitutes the non-exposed portion in the aqueous developer to remove the photosensitive layer.

In this case, the non-exposed portion may be immersed in the aqueous developer, or the aqueous developer may be continuously supplied and brought into contact with the non-exposed portion in a case where a physical action is exerted.

In addition, the liquid temperature of the aqueous developer during development is preferably 20° C. to 60° C. and more preferably 30° C. to 50° C.

In addition, a brush is used for the physical action force usually used, and the material, thickness, and length of bristles, denseness and arrangement of bristles, movement and rotation direction of brush, and the like are appropriately selected.

[Flexographic Printing Plate Precursor]

For the photosensitive layer (photosensitive resin composition) of the flexographic printing plate precursor developed with the aqueous developer according to the embodiment of the present invention, a known photosensitive resin composition in the related art can be used. Examples thereof include a resin composition containing a water-dispersible latex, rubber, a photopolymerizable monomer, a photopolymerization initiator, and a surfactant.

<Water-Dispersible Latex>

The water-dispersible latex contained in the resin composition is not particularly limited, and water-dispersible latexes used in a known flexographic printing plate in the related art can be used.

Specific examples of the water-dispersible latex include water-dispersible latex polymers such as polybutadiene latex, natural rubber latex, styrene-butadiene copolymer latex, acrylonitrile-butadiene copolymer latex, polychloroprene latex, polyisoprene latex, polyurethane latex, methylmethacrylate-butadiene copolymer latex, vinylpyridine polymer latex, butyl polymer latex, Thiokol polymer latex, and acrylate polymer latex; and polymers obtained by copolymerizing another component, such as acrylic acid and methacrylic acid, therewith. These may be used alone or in combination of two or more.

<Rubber>

The rubber contained in the resin composition is not particularly limited, and rubber materials used in a known flexographic printing plate in the related art can be used.

Specific examples of the rubber include butadiene rubber (BR), nitrile rubber (NBR), acrylic rubber, epichlorohydrin rubber, urethane rubber, isoprene rubber, styrene isoprene rubber, styrene butadiene rubber, ethylene-propylene copolymer, and chlorinated polyethylene. These may be used alone or in combination of two or more.

<Photopolymerizable Monomer>

The photopolymerizable monomer contained in the resin composition is not particularly limited, and photopolymerizable monomers used in a known flexographic printing plate in the related art can be used.

Examples of the photopolymerizable monomer include ethylenically unsaturated compounds.

Specific examples of the ethylenically unsaturated compound include (meth)acrylic monomers, (meth)acrylic oligomers, and (meth)acrylic modified polymers.

In addition, specific examples of the (meth)acrylic modified polymer include (meth)acrylic modified butadiene rubber and (meth)acrylic modified nitrile rubber.

The term "(meth)acrylic" is a notation meaning acrylic or methacrylic.

<Photopolymerization Initiator>

The photopolymerization initiator contained in the resin composition is not particularly limited as long as the photopolymerization of the above-described photopolymerizable monomer is initiated, and examples thereof include photopolymerization initiators such as alkylphenones, acetophenones, benzoin ethers, benzophenones, thioxanthones, anthraquinones, benzils, and biacetyls.

Specific examples thereof include benzyl dimethyl ketal, 2-hydroxy-2-methyl-1-phenyl-propane-1-one, methyl-o-benzoylbenzoate, and 1-hydroxycyclohexyl phenyl ketone.

<Surfactant>

From the viewpoint of improving water developability, the resin composition preferably contains a surfactant.

Examples of the surfactant include a cationic surfactant, an anionic surfactant, and a nonionic surfactant. Among these, an anionic surfactant is preferable.

Specific examples of the anionic surfactant include
aliphatic carboxylates such as sodium laurate, and sodium oleate;
higher alcohol sulfate ester salts such as sodium lauryl sulfate, sodium cetyl sulfate, and sodium oleyl sulfate;
polyoxyethylene alkyl ether sulfate ester salts such as sodium polyoxyethylene lauryl ether sulfate;
polyoxyethylene alkyl allyl ether sulfate ester salts such as sodium polyoxyethylene octyl phenyl ether sulfate and sodium polyoxyethylene nonyl phenyl ether sulfate;
alkyl sulfonates such as alkyl diphenyl ether disulfonate, sodium dodecyl sulfonate, and sodium dialkyl sulfosuccinate;
alkyl allyl sulfonates such as alkyl disulfonate, sodium dodecyl benzene sulfonate, sodium dibutyl naphthalene sulfonate, and sodium triisopropyl naphthalene sulfonate;
higher alcohol phosphate ester salts such as disodium lauryl phosphate monoester, and sodium lauryl phosphate diester; and
polyoxyethylene alkyl ether phosphate ester salts such as disodium polyoxyethylene lauryl ether phosphate monoester, and sodium polyoxyethylene lauryl ether phosphate diester.

These may be used alone or in combination of two or more.

[Manufacturing Method of Flexographic Printing Plate]

A manufacturing method of a flexographic printing plate according to an embodiment of the present invention includes an exposure step of imagewise exposing a photosensitive layer in a flexographic printing plate precursor having the photosensitive layer, a development step of, after the exposure step, performing development using the aqueous developer for a flexographic printing plate to form a non-image area and an image area, and a rinse step of, after the development step, performing rinsing with water.

[Exposure Step]

The exposure step is a step of imagewise irradiating the photosensitive layer with an actinic ray to induce crosslinking and/or polymerization of a region irradiated with the actinic ray and to cure the region.

The above-described exposure step can be performed by exposing the photosensitive layer through a mask provided on an outer surface side of the photosensitive layer.

In addition, it is also preferable to perform the exposure using a vacuum frame exposure device, and in this case, after the air between a relief forming layer and the mask is exhausted, the exposure with an actinic ray is performed.

In addition, the exposure may be performed in a state in which the oxygen concentration is lowered, or may be performed in the atmosphere. Although not particularly limited, from the viewpoint of preventing polymerization inhibition by oxygen, it is preferable that the exposure is performed at a low oxygen concentration.

[Development Step]

The development step is a step of performing developing using the above-described aqueous developer according to the embodiment of the present invention to form a non-image area and an image area, and the details are as described in the above-mentioned development method of the aqueous developer according to the embodiment of the present invention.

[Rinse Step]

The rinse step is a step of rinsing surfaces of the non-image area and the image area formed in the development step with water.

In the present invention, since the developer remaining on the surfaces of the non-image area and the image area is the above-described aqueous developer according to the embodiment of the present invention, even in a case where the aqueous developer is diluted with water used in the rinse step, adhesion and aggregation of the dispersion in the developer can be suppressed.

As a rinsing method in the rinse step, a method of washing with tap water, a method of spraying high pressure water, a method of rubbing the surfaces of the non-image area and the image area using a batch-type or transport-type brush washing machine known as a developing machine for flexographic printing plates mainly in the presence of water, and the like may be used.

[Use]

The aqueous developer for a flexographic printing plate according to the embodiment of the present invention can be used not only as an aqueous developer for a flexographic printing plate, but also as a washing solution for washing a wall surface of a bathtub of a developing device.

EXAMPLES

Hereinafter, the present invention will be described in more detail with reference to examples. Materials, amounts used, ratios, treatment contents, treatment procedures, and the like shown in the following examples can be appropriately changed without departing from the spirit of the present invention. Therefore, the scope of the present invention should not be construed as being limited by the following examples.

Examples 1 to 22 and Comparative Examples 1 to 4

Each water, surfactant, alkali metal carbonate, and additive shown in Table 1 below were formulated to have parts by mass shown in Table 1 below, thereby preparing aqueous developers.

[Flexographic Printing Plate Precursor for Evaluation]

<Commercially Available Product>

In the evaluation of Examples 1 to 14 and 16 to 22, and Comparative Examples 1 to 4, a commercially available water-developed type flexographic printing plate precursor [FLENEX FW-L2, manufactured by FUJIFILM Corporation] was used.

<Product>

In the evaluation of Example 15, a flexographic printing plate precursor produced by the following method was used.

Preparation of Photosensitive Resin Composition

A mixture containing 54.5 parts by mass of a water-dispersible latex (manufactured by ZEON CORPORATION, Nipol LX111NF, water-dispersible latex of polybutadiene, solid content: 55%), 10 parts by mass of 1,9-nonanediol dimethacrylate (manufactured by Shin-Nakamura Chemical Co., Ltd., NK ESTER NOD-N), 12 parts by mass of a telechelic polymer (manufactured by OSAKA ORGANIC CHEMICAL INDUSTRY LTD., BAC-45) (polybutadiene having acryloyloxy groups at both terminals, Mw=10,000), and 1 part by mass of polyoxyethylene lauryl ether (manufactured by TAKEMOTO OIL & FAT Co., Ltd., Pionin D-1105) was obtained.

This mixture, 20 parts by mass of butadiene rubber (manufactured by Asahi Kasei Co., Ltd., NF35R), 15 parts by mass of a plasticizer (liquid paraffin), and 5 parts by mass of a surfactant (manufactured by NOF Corporation, RAPISOL A-80, effective content: 80%) were kneaded in a kneader set at 110° C. for 45 minutes. Thereafter, 0.2 parts by mass of a thermal polymerization inhibitor and 3 parts by mass of a photopolymerization initiator (manufactured by Tokyo Chemical Industry Co., Ltd., benzyl dimethyl ketal) were put into the kneader, and the mixture was kneaded for 5 minutes to obtain a photosensitive resin composition.
(Production of Laminate for Infrared Ablation Layer)

812 parts by mass of methyl isobutyl ketone was added to a mixture of 50 parts by mass of acrylic resin (manufactured by Negami Chemical Industrial Co., Ltd., Hi-pearl M-5000), 50 parts by mass of an elastomer (manufactured by ZEON CORPORATION, Nipol DN-101), and 100 parts by mass of carbon black (manufactured by Mitsubishi Chemical Corporation, MA-8), and the mixture was mixed with a stirring blade. After dispersing the obtained mixed solution with a paint shaker, methyl isobutyl ketone was further added thereto so that the solid content was 15% by mass to obtain a polymer/carbon black dispersion liquid (coating solution for an infrared ablation layer).

Next, the coating solution for an infrared ablation layer was applied to one side of a PET film (cover film) having a thickness of 75 μm using a bar coater so that the thickness after drying was 1.0 μm. Thereafter, by drying the film in an oven set at 140° C. for 5 minutes, a laminate (laminate for an infrared ablation layer) in which an infrared ablation layer was formed on a protective film was produced.
(Production of Flexographic Printing Plate Precursor)

An adhesive was applied to one side of a PET film (substrate) having a thickness of 125 μm to form an adhesive layer on the substrate. The photosensitive resin composition prepared as described above was sandwiched between the above-described adhesive layer and the infrared ablation layer of the laminate for an infrared ablation layer produced as described above, and the laminate was pressed with a press machine heated to 80° C. so that the thickness of the layer (photosensitive layer) of the photosensitive resin composition was 1 mm, thereby producing a flexographic printing plate precursor including the substrate, the adhesive layer, the photosensitive layer, the infrared ablation layer, and the protective film in this order.

[Evaluation]
<Developability>

The cover film of the precursor shown in Table 1 below was peeled off, and the produced flexographic printing plate precursor was exposed with an exposure device in which 1540 W chemical lamps were arranged for 2 seconds from the substrate side from a distance of 15 cm (back exposure).

Thereafter, development was performed for 3 minutes with a brush type washing machine (liquid temperature: 50° C.) containing each of the prepared aqueous developers.

Thereafter, the obtained flexographic printing plate was dried with hot air of 60° C. until the moisture was removed. The thickness of the obtained flexographic printing plate was measured using a constant pressure thickness measuring device, and the change in film thickness per minute (development speed) was calculated from the change in thickness before and after development. The evaluation was performed according to the following standards. The results are shown in Table 1 below. Practically, it is preferable that the evaluation is B or higher.
(Evaluation Standard)

A: development speed was 170 μm/min or more.
B: development speed was 100 μm/min or more and less than 170 μm/min.
C: development speed was less than 100 μm/min <Suppression of Aggregation>

The cover film of the precursor shown in Table 1 below was peeled off, and the produced flexographic printing plate precursor was exposed with an exposure device in which 1540 W chemical lamps were arranged for 2 seconds from the substrate side from a distance of 15 cm (back exposure).

Thereafter, with a brush type washing machine (liquid temperature: 50° C.) containing each of the prepared aqueous developers, development was performed for an optional time so that the solid content of a developing residue (dispersion) was 5.0% by mass. The solid content of the developing residue was obtained by measuring 1.0 g of the aqueous developer used (hereinafter, also abbreviated as a "fatigue solution"), drying at 85° C. for 1 hour, and calculating solid content % in the fatigue solution from the weight change before and after drying.

Next, 1.0 g (solid content: 0.05 g) of the fatigue solution was measured and mixed with 9.0 g of well water having a hardness of approximately 60. After allowing to stand for 18 hours, the fatigue solution was filtered using a 1.0 μm pore filter. After the filtration residue was sufficiently dried, the mass was measured and the residue aggregation % was calculated from the change in solid content. The evaluation was performed according to the following standards. The results are shown in Table 1 below. Practically, it is preferable that the evaluation is B or higher.

Residue aggregation %=(Filtration residue (g)÷0.05 (g))×100

(Evaluation Standard)

A: residue aggregation was less than 25%.
B: residue aggregation was 25% or more and less than 50%.
C: residue aggregation was 50% or more and less than 75%.
D: residue aggregation was 75% or more.

TABLE 1

| | | Water | | Surfactant | | |
| --- | --- | --- | --- | --- | --- | --- |
| | Plate material | Material | % by mass | Material | % by mass | HLB value |
| Example 1 | Commercially available product | Pure water | 99.5 | Pionin D-6112 | 0.5 | 10.9 |
| Example 2 | Commercially available product | Pure water | 99.5 | Pionin D-6115 | 0.5 | 12.0 |
| Example 3 | Commercially available product | Pure water | 99.5 | Pionin D-6112W | 0.5 | 13.2 |
| Example 4 | Commercially available product | Pure water | 99.5 | Emulgen A-60 | 0.5 | 12.8 |
| Example 5 | Commercially available product | Pure water | 99.5 | Emulgen A-90 | 0.5 | 14.5 |
| Example 6 | Commercially available product | Pure water | 99.5 | Emulgen A-500 | 0.5 | 18.0 |
| Example 7 | Commercially available product | Pure water | 99.5 | Eleminol HB-29 | 0.5 | Not disclosed |
| Example 8 | Commercially available product | Pure water | 99.5 | LATEMUL E-1000A | 0.5 | Not disclosed |

TABLE 1-continued

| | | | | | | | Alkali metal carbonate | | Additive | | Evaluation | |
|---|---|---|---|---|---|---|---|---|---|---|---|---|
| | | | | | | | Material | % by mass | Material | % by mass | Developability | Aggregation suppression |
| Example 9 | Commercially available product | Pure water | 99.0 | Pionin D-6112 | 1.0 | 10.9 | — | | — | | B | A |
| Example 10 | Commercially available product | Pure water | 99.0 | Pionin D-6112 | 0.5 | 10.9 | Sodium carbonate | 0.5 | — | | A | B |
| Example 11 | Commercially available product | Pure water | 99.0 | Pionin D-6112 | 0.5 | 10.9 | Finish detergent | 0.5 | — | | A | B |
| Example 12 | Commercially available product | Pure water | 99.5 | Pionin D-6112 | 0.5 | 10.9 | Sodium carbonate | 0.5 | Trisodium citrate | 0.5 | A | A |
| Example 13 | Commercially available product | Pure water | 99.5 | Pionin D-6112 | 0.5 | 10.9 | Finish detergent | 0.5 | Trisodium citrate | 0.5 | A | A |
| Example 14 | Commercially available product | Pure water | 99.5 | Pionin D-6112 | 1.0 | 10.9 | Finish detergent | 0.5 | — | | A | A |
| Example 15 | Product | Pure water | 99.5 | Pionin D-6112 | 1.0 | 10.9 | Finish detergent | 0.5 | — | | A | A |
| Example 16 | Commercially available product | Pure water | 99.5 | Pionin D-6120 | 0.5 | 13.2 | — | | — | | B | B |
| Example 17 | Commercially available product | Pure water | 99.0 | Pionin D-6120 | 0.1 | 13.2 | — | | — | | B | A |
| Example 18 | Commercially available product | Pure water | 99.5 | Newkalgen FS-3PG | 0.5 | Not disclosed | — | | — | | B | B |
| Example 19 | Commercially available product | Pure water | 99.5 | Newkalgen FS-7S | 0.5 | Not disclosed | — | | — | | B | B |
| Example 20 | Commercially available product | Pure water | 99.5 | Newkalgen P-205S30 | 0.5 | Not disclosed | — | | — | | B | B |
| Example 21 | Commercially available product | Pure water | 99.5 | Aqualon AR | 0.5 | Not disclosed | — | | — | | B | B |
| Example 22 | Commercially available product | Pure water | 99.5 | Aqualon AN | 0.5 | Not disclosed | — | | — | | B | B |
| Comparative example 1 | Commercially available product | Pure water | 100.0 | — | | | — | | — | | C | D |
| Comparative example 2 | Commercially available product | Pure water | 99.5 | Pionin D-1105 | 0.5 | 10.8 | — | | — | | B | D |
| Comparative example 3 | Commercially available product | Pure water | 99.5 | Pionin D-1100 | 0.5 | 14.1 | — | | — | | B | D |
| Comparative example 4 | Commercially available product | Pure water | 99.5 | Pionin D-1105S | 0.5 | 10.5 | — | | — | | B | D |

The following components were used as the components shown in Table 1 above.
Pionin D-6112: polyoxyethylene polystyrylphenyl ether (manufactured by TAKEMOTO OIL & FAT Co., Ltd.)
Pionin D-6115: polyoxyethylene polystyrylphenyl ether (manufactured by TAKEMOTO OIL & FAT Co., Ltd.)
Pionin D-6112W: polyoxyalkylene polystyrylphenyl ether (manufactured by TAKEMOTO OIL & FAT Co., Ltd.)
Pionin D-6120: polyoxyethylene polystyrylphenyl ether (manufactured by TAKEMOTO OIL & FAT Co., Ltd.)
Emulgen A-60: polyoxyethylene distyrenated phenyl ether (manufactured by Kao Corporation)
Emulgen A-90: polyoxyethylene distyrenated phenyl ether (manufactured by Kao Corporation)
Emulgen A-500: polyoxyethylene distyrenated phenyl ether (manufactured by Kao Corporation)
Eleminol HB-29: polyoxyethylene tribenzylphenyl ether (manufactured by SANYO CHEMICAL INDUSTRIES, LTD.)
LATEMUL E-1000A: polyoxyethylene styrylphenyl ether ammonium sulfate (manufactured by Kao Corporation)
Newkalgen FS-3PG: polyoxyethylene allylphenylether phosphate amine salt (manufactured by TAKEMOTO OIL & FAT Co., Ltd.)
Newkalgen FS-7S: polyoxyalkylene allylphenyl ether sulfate-Na (manufactured by TAKEMOTO OIL & FAT Co., Ltd.)
Newkalgen P-205S30: polyoxyalkylene allylphenyl ether sulfate-Na (manufactured by TAKEMOTO OIL & FAT Co., Ltd.)
Aqualon AR: polyoxyethylene styrenated propenylphenyl ether ammonium sulfate (manufactured by DKS Co., Ltd.)
Aqualon AN: polyoxyethylene styrenated propenylphenyl ether (manufactured by DKS Co., Ltd.)
Pionin D-1105: polyoxyethylene lauryl ether (manufactured by TAKEMOTO OIL & FAT Co., Ltd.)
Pionin D-1100: polyoxyethylene lauryl ether (manufactured by TAKEMOTO OIL & FAT Co., Ltd.)
Pionin D-1105S: polyoxyethylene secondary alkyl ether (manufactured by TAKEMOTO OIL & FAT Co., Ltd.)
Sodium carbonate: reagent manufactured by FUJIFILM Wako Chemicals Corporation
Finish detergent: detergent for dishwasher manufactured by Reckitt Benckiser Group PLC.
Trisodium citrate: reagent manufactured by FUJIFILM Wako Chemicals Corporation As shown in Table 1 above, it was found that, in a case where a surfactant was not formulated, the aqueous developer was inferior in developability and could not suppress the aggregation of the developing residue (Comparative Example 1).

In addition, it was found that, in a case where a surfactant which did not correspond to the specific surfactant, such as polyoxyethylene lauryl ether, was formulated, the developability was good, but the aggregation of the developing residue could not be suppressed (Comparative Examples 2 to 4).

On the other hand, it was found that, in a case where the specific surfactant was formulated, good developability could be maintained and the aggregation of the developing residue could be suppressed (Examples 1 to 22).

In particular, from the comparison of Examples 1 to 6, it was found that, in a case where the HLB value of the specific surfactant was less than 14, the aggregation of the developing residue could be further suppressed.

In addition, from the comparison of Example 1 and Example 9, it was found that, in a case where the content of the specific surfactant was 1% to 5% by mass, the aggregation of the developing residue could be further suppressed.

In addition, from the comparison of Examples 1, 10, and 11, it was found that, in a case where the alkali metal carbonate was formulated, the developability was further improved.

In addition, from the comparison of Example 10 and Example 12, and comparison of Example 11 and Example 13, it was found that, in a case where the metal sequestering agent was formulated, the aggregation of the developing residue could be further suppressed.

What is claimed is:

1. A manufacturing method of a flexographic printing plate having a non-image area and an image area, comprising:
    an exposure step of imagewise exposing a photosensitive layer in a flexographic printing plate precursor having the photosensitive layer;
    a development step of, after the exposure step, performing development using an aqueous developer for a flexographic printing plate comprising a surfactant represented by Formula (1) and water to form the non-image area and an image area; and
    a rinse step of, after the development step, performing rinsing with water,

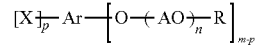
(1)

where, in Formula (1),

Ar represents an m-valent aromatic group and m represents an integer of 1 to 8,

X represents an aryl group, an aralkyl group, or an alkenyl group and p represents an integer of 0 to 3, which is smaller than m, in a case where p is 2 or 3, a plurality of X's may be the same or different from each other, A represents an alkylene group having 2 to 4 carbon atoms, R represents a hydrogen atom or an anionic group, and n represents an integer of 1 to 100, in a case where n is an integer of 2 to 100, a plurality of A's may be the same or different from each other, and in a case where m-p is an integer of 2 to 6, a plurality of A's, n's, and R's may all be the same or different from each other.

2. The manufacturing method of a flexographic printing plate having a non-image area and an image area according to claim 1,
    wherein a content of the surfactant is 0.1% to 20% by mass.

3. The manufacturing method of a flexographic printing plate having a non-image area and an image area according to claim 1,
    wherein X in Formula (1) is an aralkyl group.

4. The manufacturing method of a flexographic printing plate having a non-image area and an image area according to claim 1,
    wherein X in Formula (1) is a 2-phenylethan-2-yl group or a benzyl group.

5. The manufacturing method of a flexographic printing plate having a non-image area and an image area according to claim 1,
    wherein p in Formula (1) represents an integer of 1 to 3.

* * * * *